United States Patent

Ishii

[11] 4,039,964
[45] Aug. 2, 1977

[54] AUDIO FREQUENCY TRANSISTOR AMPLIFIER

[75] Inventor: Kazuo Ishii, Tokyo, Japan

[73] Assignee: Tokyo Shibaura Electric Co., Ltd., Kawasaki, Japan

[21] Appl. No.: 678,550

[22] Filed: Apr. 20, 1976

[51] Int. Cl.$^2$ ............... H03F 3/18; H03F 3/183
[52] U.S. Cl. ............... 330/13; 330/22; 330/149
[58] Field of Search ............... 330/13, 15, 22, 40, 330/149

[56] References Cited

U.S. PATENT DOCUMENTS 3,721,914  3/1973  Nakamura ............... 330/13 X

Primary Examiner—James B. Mullins
Attorney, Agent, or Firm—Oblon, Fisher, Spivak, McClelland & Maier

[57] ABSTRACT

In an audio frequency transistor amplifier comprising an output amplifier circuit having a pair of complementary transistors, and a bias circuit having a resistor and a diode or diodes for biasing the pair of complementary transistors, the bias circuit generates harmonics of an audio signal to be amplified and reproduced due to nonlinear property of diode, thereby to cause a decrease in the articulation and resolution of a reproduced sound. This invention resides in coupling in parallel, in order to eliminate or reduce the harmonic noises generated by the bias circuit, at least one nonpolarized capacitor to the bias circuit. In addition to the nonpolarized capacitor, an electrolytic capacitor or polarized capacitor may be coupled in parallel to the bias circuit.

9 Claims, 2 Drawing Figures

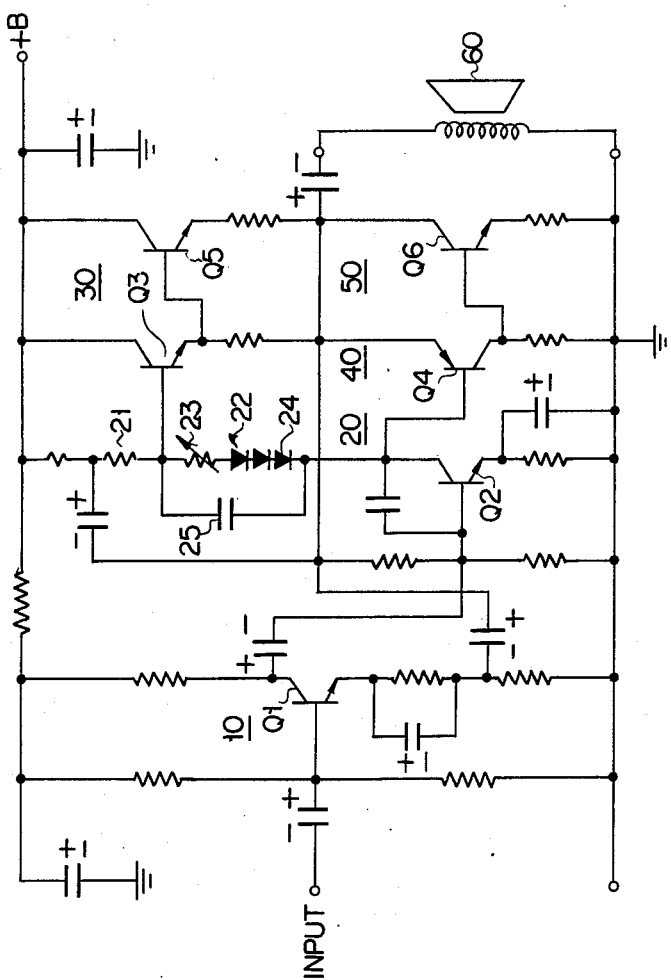
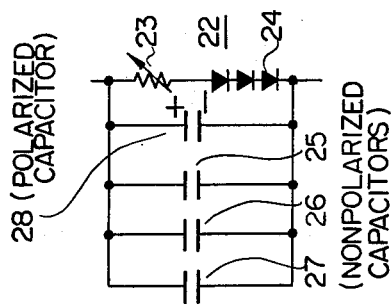

AUDIO FREQUENCY TRANSISTOR AMPLIFIER

This invention relates to an audio frequency transistor amplifier.

Generally, an audio frequency amplifier should be so designed as to amplify with high fidelity audio frequency electric signals obtained from an audio source such as a microphone, a disk, a tape or a radio receiver. The causes of interrupting the high fidelity amplification usually include the nonlinear distortion occurring upon passage of the electric signal through an active device such as a vacuum tube or a transistor, and the cross modulation distortion caused by the electric signals having different frequencies, etc. The present development of semiconductor manufacturing technique and circuit design technique makes it possible to suppress the occurrence of the various distortions to a negligible level.

Even in the case of reproducing musical sounds using a conventional audio frequency transistor amplifier having a sufficiently low-distortion characteristic, however, satisfactory results cannot be necesssarily obtained in the light of a listener's auditory sense. This is considered because the distortions or noises whose level is too low to measure by a measuring instrument are generated by the unknown causes in the amplifier, and are sensed by a listener's auditory sense. To explain in more detail, the reason is considered that a voice and a musical sound to be reproduced, as well known, each have a very much complicated peculiar waveform, in other words each contain as a peculiar frequency spectrum a fundamental wave component and a number of harmonic components, and especially these harmonics are masked by, or interfere with, the noises generated by the unknown causes to cause a decrease in the articulation or resolution of a reproduced sound.

As a result of having conducted various experiments, the present inventor has found that a nonlinear passive circuit element, especially a forward biased diode or diodes included in a DC circuit coupled between the input electrodes of a pair of complementary transistors included in a complementary push-pull output circuit, plays an important role as the unknown noise generating source.

As well known, a diode exhibits a nonlinear voltage-to-current characteristic and therefore, when an AC signal or audio signal is applied to the diode, causes the generation of harmonics of the AC signal. That is, it is sufficiently considered that the diode included in the bias circuit, i.e., a nonlinear semiconductor passive circuit element operates as a source of generating relatively high frequency noises (in this specification, these noises are hereinafter referred to as "harmonic noises"). Since the generation of the harmonic noises by the bias circuit are effected at the initial stage of the output circuit, they are sequentially amplified and therefore supposed to have a worse effect upon the reproduced sound.

Accordingly, the object of the invention is to provide an audio frequency transistor amplifier capable of eliminating or reducing the harmonic noises generated by a nonlinear semiconductor passive circuit element included in a bias circuit for providing a DC potential difference between the input electrodes of a pair of complementary transistors in a complementary push-pull output amplifier circuit.

The above object can be achieved by coupling in parallel a nonpolarized capacitor to the bias circuit.

The nonpolarized capacitor may include a paper capacitor, a metalized paper capacitor, or a plastic film capacitor.

It is well known that a nonpolarized capacitor has a much smaller loss than an electrolytic capacitor which is well used in a transistor amplifier. Therefore, when the nonpolarized capacitor is chosen to have a capacitance value capable of providing a reactance sufficiently low with respect to the relatively high frequency noises generated by the bias circuit it effectively absorbs or shortcircuits the harmonic noises to eliminate or reduce them. Further, through additionally coupling in parallel a large-capacitance electrolytic capacitor to the bias circuit, the relatively low frequency noises generated by the bias circuit can be eliminated or reduced.

The nonpolarized capacitor has a nonlinear transfer characteristic although to a small extent. For this reason, there is a possibility of the nonpolarized capacitor newly generating harmonic noises. In order to eliminate or reduce the harmonic noises generated by that nonpolarized capacitor, a small-loss nonpolarized capacitor or capacitors may additionally be coupled in parallel to the bias circuit.

The subject matter of the invention does not reside in using a costly special circuit arrangement but in simply coupling in parallel at least one nonpolarized capacitor to the bias circuit for the purpose of eliminating or reducing the harmonic noises. Unfortunately, however, difficulties are encountered in quantitatively showing the effect of this invention since a measuring technique therefore has not yet been established.

It is believed, however, that an experienced audio engineer would be able to aurally confirm with ease the effect of the invention through simply parallel coupling in accordance with the teaching of this invention a nonpolarized capacitor to the bias circuit used in an existing transistor amplifier.

This invention can be more fully understood from the following detailed description when taken in conjunction with the accompanying drawing, in which:

FIG. 1 is a schematic circuit diagram of a transistor amplifier according to an embodiment of the invention wherein a nonpolarized capacitor is coupled to a bias circuit in order to eliminate or reduce the harmonic noises generated by the bias circuit; and FIG. 2 shows another embodiment of the invention wherein a plurality of nonpolarized capacitors and an electrolytic capacitor are coupled in parallel to the bias circuit in order to raise the harmonic noise eliminating or reducing effect.

FIG. 1 shows an example of a quasi-complementary single-ended push-pull transistor amplifier comprising harmonic noise eliminating means according to the invention. The transistor amplifier circuit per se shown in FIG. 1 is well known and a detailed description thereof is believed to be unnecessary.

The amplifier circuit of FIG. 1 comprises a predriver amplifier circuit 10 including a transistor Q1 for amplifying an audio input signal, a driver amplifier circuit 20 including a transistor Q2 and coupled to the output of the predriver amplifier circuit 10, and an output amplifier circuit 30 driven by the driver amplifier circuit 20. The output amplifier circuit 30 comprises a complementary amplifier stage 40 including a pair of complementary transistors Q3 and Q4, and an output amplifier stage 50 including output transistors Q5 and Q6. The output of output amplifier circuit 30 may be coupled to a load such as a loudspeaker 60.

The driver amplifier circuit 20 comprises a load resistor 21 coupled to the collector of transistor Q2, and a bias circuit 22 coupled between the collector of transistor Q2 and the load resistor 21 and including a resistor 23, preferably a variable resistor, and at least one nonlinear semiconductor passive element or diode 24. Input electrodes or base electrodes of the complementary transistors Q3 and Q4 are coupled to both ends of the bias circuit 22, respectively.

The nonlinear semiconductor passive element 24 is coupled as shown to a power source and the driver transistor Q2 with a polarity being forward biased. The resistor 23 has a resistance value on the order of scores of ohms, and therefore a DC potential difference of about 2 volts is produced across the bias circuit 22, thereby to bias each of the complementary transistors Q3 and Q4 to the Class B operating point. Since the impedance of the resistor 23 and diodes 24 is low, both ends of the bias circuit 22 are at substantially the same potential with respect to an alternating current. The transistors Q2 and Q4 are alternately driven by an audio signal appearing across the load resistor 21 having a resistance value of several kilo-ohms.

The diodes 24 of the bias circuit 22 are provided for the purpose of stabilizing bias voltages for the transistors Q3 and Q4, and as a diode a diode-connected transistor may be used as in the case of an integrated circuit.

As above described, the diodes 24 are forward-biased and therefore, upon passage therethrough of an AC signal or audio signal, cause due to nonlinear property thereof the generation of harmonic noises of that AC signal or audio signal. In order to eliminate or reduce the harmonic noises generated by the diodes 24, in accordance with the invention, at least one nonpolarized capacitor 25 such as a paper capacitor, a metalized capacitor, or a plastic film capacitor is coupled in parallel to the bias circuit 22 or between the base electrodes of the complementary transistors Q3 and Q4.

It is well known that a nonpolarized capacitor has much smaller-loss characteristic than a polarized capacitor such as an electrolytic capacitor, and the loss resistance of the nonpolarized capacitor is smaller than the resistance value of the bias circuit 22.

Accordingly, when the nonpolarized capacitor 25 is chosen to have a capacitance value capable of providing a sufficiently low reactance with respect to relatively high frequency noises generated by the bias circuit, the harmonic noises can be absorbed or shortcircuited.

Generally, the capacitance of a nonpolarized capacitor is smaller than that of an electrolytic capacitor. Accordingly, the provision of only the nonpolarized capacitor is insufficient to absorb relatively low frequency noises. For this reason, a large-capacitance electrolytic capacitor having a relatively small loss in low frequency range may be coupled in parallel to the bias circuit 22 together with the nonpolarized capacitor. Note, however, that the coupling of only the electrolytic capacitor to the bias circuit is not desirable because of the following reason. Namely, the electrolytic capacitor has a nonlinear loss characteristic that an inner loss including a dielectric loss tan δ and electrode losses attributed to the electrode structure presents a rapid increase over intermediate frequency range to high frequency range, so that it is insufficient to absorb or shortcircuit relatively high frequency noises.

The nonpolarized capacitor has a nonlinear transfer characteristic although to a very small extent, and therefore there is a possibility of harmonic noises being newly generated when an audio signal passes through the nonpolarized capacitor. Elimination or reduction of these newly generated harmonic noises is also desirable for enhancing the articulation and resolution of a reproduced sound. In order to eliminate or reduce the harmonic noises generated by this first nonpolarized capacitor, a second nonpolarized capacitor may be additionally coupled in parallel to the bias circuit. In this case, however, this second nonpolarized capacitor is required to have a smaller loss than the first nonpolarized capacitor and may be chosen to have a capacitance value capable of providing a low reactance to the harmonic noises generated by the first nonpolarized capacitor, or chosen to have a capacitance value smaller than that of the first nonpolarized capacitor. In this way, in order to enhance the effect of eliminating or reducing the harmonic noises generated by the bias circuit, a plurality of nonpolarized capacitors are preferably used.

FIG. 2 shows an embodiment of the invention wherein a plurality of nonpolarized capacitors are coupled in parallel to the bias circuit 22. In this embodiment, a polyethylene terephthalate film capacitor having a capacitance of about 4.7 microfarads is used as a first nonpolarized capacitor 25; a polypropylene film capacitor having a capacitance of about 0.33 microfarad and having a smaller loss than the polyethylene terephthalate film capacitor is used as a second nonpolarized capacitor 26; a polystyrene capacitor having a capacitance of about 0.01 microfarad and having a smaller loss than the polypropylene film capacitor is used as a third nonpolarized capacitor 27; and an electrolytic capacitor or polarized capacitor 28 having a capacitance of 100 to 1000 microfarads is used. Apparently, the four capacitors coupled in parallel to the bias circuit 22 are related to each other such that the electrolytic capacitor 28, first nonpolarized capacitor 25, second non-polarized capacitor 26, and third nonpolarized capacitor 27 become smaller in the sequential order mentioned with respect to loss and capacitance. The satisfactory results in terms of aural sense were obtained by means of such an embodiment as shown in FIG. 2.

As above described, this invention enables an enhancement in the articulation and resolution of a reproduced sound simply by parallel coupling at least one nonpolarized capacitor to the bias circuit for biasing the pair of complementary transistors. This provides a very great economical advantage.

This invention can be applied not only to an amplifier using bipolar transistors but also to an amplifier using unipolar transistors. Further, this invention can be applied also to a complementary symmetry push-pull circuit and further applied also to an amplifier used to record audio signals on a recording medium.

What is claimed is:

1. A transistor amplifier for amplifying audio frequency signals comprising:
   a complementary push-pull output amplifier circuit including a pair of complementary transistors which may be coupled to a load;
   a driver amplifier circuit including a load resistor for developing an output signal to drive alternately said pair of complementary transistors, a bias circuit coupled in series to said load resistor and having at least one nonlinear semiconductor passive circuit element for providing a predetermined DC potential difference between input electrodes of said pair of complementary transistors, said nonlinear semiconductor passive circuit element generating undesirable harmonics of said audio frequency signals whereby the audio fidelity of said transistor amplifier is reduced; and, a plurality of capacitors having successively smaller values of capacitance, each coupled in parallel to one another and to said nonlinear seimconductor passive circuit element in said bias circuit for short circuiting successively higher frequency harmonics generated by said nonlinear semiconductor passive circuit element thereby enhancing the fidelity of said transistor amplifier.

2. An audio frequency transistor amplifier according to claim 1, wherein: said plurality of capacitors includes a first nonpolarized capacitor and an electrolytic capacitor having a larger capacitance than said first nonpolarized capacitor.

3. An audio frequency transistor amplifier according to claim 2, wherein said first nonpolarized capacitor is a paper capacitor.

4. An audio frequency transistor amplifier according to claim 2, wherein said first nonpolarized capacitor is a metalized paper capacitor.

5. An audio frequency transistor amplifier according to claim 2, wherein said first nonpolarized capacitor is a plastic film capacitor.

6. An audio frequency transistor amplifier according to claim 2, wherein a second nonpolarized capacitor having a smaller loss than said first nonpolarized capacitor is coupled in parallel to said first nonpolarized capacitor.

7. An audio frequency transistor amplifier according to claim 6, wherein said second nonpolarized capacitor has a smaller capacitance than said first nonpolarized capacitor.

8. An audio frequency transistor amplifier according to claim 6, wherein a third nonpolarized capacitor having a smaller loss than said second nonpolarized capacitor is coupled in parallel to said second nonpolarized capacitor.

9. An audio frequency transistor amplifier according to claim 8, wherein said third nonpolarized capacitor has a smaller capacitance than said second nonpolarized capacitor.

* * * * *